(12) United States Patent
Pawlak

(10) Patent No.: US 7,790,545 B2
(45) Date of Patent: Sep. 7, 2010

(54) SEMICONDUCTOR DEVICE HAVING A POLYSILICON ELECTRODE INCLUDING AMORPHIZING, RECRYSTALLISING, AND REMOVING PART OF THE POLYSILICON ELECTRODE

(75) Inventor: Bartlomiej J. Pawlak, Heverlee (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/917,103

(22) PCT Filed: Jun. 13, 2006

(86) PCT No.: PCT/IB2006/051879

§ 371 (c)(1),
(2), (4) Date: Nov. 14, 2008

(87) PCT Pub. No.: WO2006/134553

PCT Pub. Date: Dec. 21, 2006

(65) Prior Publication Data

US 2009/0159992 A1 Jun. 25, 2009

(30) Foreign Application Priority Data

Jun. 16, 2005 (EP) .................................. 05105323

(51) Int. Cl.
*H01L 21/8238* (2006.01)
*H01L 21/302* (2006.01)
*H01L 21/461* (2006.01)

(52) U.S. Cl. ...................................... 438/229; 438/682

(58) Field of Classification Search ................. 438/229, 438/682; 257/E29.266
See application file for complete search history.

(56) References Cited

U.S. PATENT DOCUMENTS

| 5,966,597 | A | 10/1999 | Wright |
| 6,297,115 | B1 | 10/2001 | Yu |
| 6,335,253 | B1 | 1/2002 | Chong et al. |
| 2003/0008461 | A1* | 1/2003 | Forbes et al. ................ 438/268 |
| 2004/0115889 | A1 | 6/2004 | Jain et al. |
| 2005/0090109 | A1* | 4/2005 | Carter et al. ................ 438/692 |

FOREIGN PATENT DOCUMENTS

| EP | 0727815 A2 | 8/1996 |
| EP | 1650796 A2 | 4/2006 |

* cited by examiner

*Primary Examiner*—William M. Brewster

(57) ABSTRACT

A method of manufacturing a semiconductor device such as a MOS transistor. The device comprises a polysilicon gate (10) and doped regions (22,24) formed in a semiconductor substrate (12), separated by a channel region (26). The exposed surface of the semiconductor substrate is amorphized, by ion bombardment for example, so as to inhibit subsequent diffusion of the dopant ions during thermal annealing. Low thermal budgets are favored for the activation and polysilicon regrowth to ensure an abrupt doping profile for the source/drain regions. As a consequence an upper portion (10*b*) of the gate electrode remains amorphous. The upper portion of the gate electrode is removed so as to allow a low resistance contact to be made with the polysilicon lower portion (10*a*).

15 Claims, 4 Drawing Sheets

SEMICONDUCTOR DEVICE HAVING A POLYSILICON ELECTRODE INCLUDING AMORPHIZING, RECRYSTALLISING, AND REMOVING PART OF THE POLYSILICON ELECTRODE

The invention relates to a method of manufacturing a semiconductor device having a polysilicon electrode which is subject to an amorphisation and recrystallisation process. In particular, but not exclusively, the invention relates to a method of manufacturing a MOS transistor having a polysilicon gate electrode.

There is a continued pressure in the field of semiconductor device manufacture to reduce the size of devices. Such a reduction allows more devices to be incorporated on a wafer of a given size. Equally, there is a continued pressure to maintain, if not improve, device performance. As dimensions of device components are made smaller then certain undesirable electrical effects become more apparent.

A good example of a device where such effects occur is the MOSFET. Here, source and drain extension regions, separated by a semiconductor channel region, comprise respective doped portions of a doped semiconductor wafer. P-type dopants, such as boron, are implanted if the substrate is doped n-type. N-type dopants, such as phosphorus or arsenic, are implanted if the substrate is doped p-type. Therefore, a p-n junction is provided which creates a potential barrier for current flowing between the source and drain regions. Voltages applied to an insulated gate electrode disposed above the channel serve to control the height of the potential barrier and, therefore, the current flowing through the channel region.

There is a desire to form the source and drain extension regions with a shallow, but abrupt, junction profile so as to avoid unwanted electrical effects caused by a relatively short channel region. Junctions are typically formed by implanting dopants into a semiconductor wafer, or substrate. Using the already-formed gate to mask the channel region, the dopants are implanted into the upper surface of the semiconductor wafer. The dopants are then activated by a thermal anneal. The consequential heating of the semiconductor causes the dopants to diffuse deeper into the semiconductor, thus reducing the abruptness of the junction profile. This is a recognised problem.

US patent application No. US-2004/0115889 discloses an amorphizing implant process which can be carried out before or after the implantation of the dopant species. The implantation of species such as silicon or germanium causes an upper region of the semiconductor substrate to become amorphous. Following the amorphizing implant and the n-type or p-type doping implant, a thermal anneal is carried out to activate the dopants and recrystallise the amorphous regions.

FIG. 1a shows a highly schematic sectional view of the substrate during an amorphizing step similar to that disclosed in US-2004/0115889. A gate electrode 10, initially formed of polycrystalline silicon (polysilicon), is insulated from the semiconductor substrate 12 by a gate dielectric 14. The exposed surface of the semiconductor substrate is amorphized by implanting germanium atoms for example, represented by arrows 100. The energy carried by the implanted germanium serves to disrupt the regular crystalline lattice near to the polysilicon surface, thereby creating an amorphous region. N-type or p-type dopant ions are then implanted (not shown) into the amorphized regions of the substrate.

A thermal anneal is executed to drive solid phase epitaxial regrowth of the amorphized regions together with activation of the dopants. Such an amorphisation and regrowth process has been shown to provide excellent dopant activation levels and abrupt junction profiles. With reference to FIG. 1b, the activated source and drain extensions 22,24 are aligned with the edges of the gate 10 and are separated by the undoped channel region 26. The amorphizing serves to create an amorphous/crystalline boundary which inhibits diffusion of the dopant ions, thereby aiding abrupt junction formation.

A problem associated with carrying out an amorphizing implant before dopant activation is that at least part of the polysilicon gate also becomes amorphized. The thermal budget required to recrystallise the gate is significantly higher than that for the bulk semiconductor. This results in partial recrystallisation of the gate when low temperature budgets are used. As demonstrated in FIG. 1b, a lower portion of the gate 10a is successfully regrown, whereas an upper portion 10b remains amorphous.

FIG. 2 is a graph showing experimental results for the resistivity values of polysilicon gates following a preamorphizing implant (PAI) of germanium and a thermal (regrowth) anneal of 1 minute. The 'D02' plot, represented by diamonds, shows the resistance of the gate with no PAI. It can be seen that the plots for the PAI of germanium having higher energies show a significantly increased resistance at lower thermal budgets.

FIG. 3 shows a sectional X-TEM image of a gate having undergone a PAI of germanium and a thermal anneal at 680° C. for one minute. This is represented in FIG. 2 by the data point highlighted as 'X'. The upper portion of the gate, indicated by the arrow in FIG. 2, is still amorphous. The relatively high resistance of this gate, and resulting poor device performance, is attributed to this amorphous portion.

At thermal budgets over approximately 780° C., the gate becomes fully recrystallised and, as a consequence, has a lower, more favourable resistance. However, at these high temperatures, the source and drain junctions start to deactivate, caused by increased diffusion of the dopants. Therefore, there is no process window in which the gate can be fully recrystallised and the junctions can be kept sufficiently abrupt.

It is an object of the present invention to provide an improved method of manufacturing a semiconductor device.

It is a further object of the present invention to provide a method of manufacturing a semiconductor device which comprises a fully recrystallised gate and junctions which are kept sufficiently abrupt.

According to the present invention there is provided a method of manufacturing a semiconductor device comprising the steps of forming a gate electrode of polysilicon on a semiconductor substrate, amorphizing the exposed surface of the semiconductor substrate and the gate electrode, doping regions of the semiconductor substrate adjacent the gate electrode, then, recrystallising a portion of the gate electrode and the semiconductor substrate, and, removing an upper portion of the gate electrode. By removing an upper portion of the gate electrode after the recrystallisation step, the freedom of choice for the processing temperature is increased. Low thermal budgets can be used freely to ensure the desired junction profile is maintained whilst the extent of recrystallisation of the gate electrode is not critical. Any remaining amorphous silicon in the gate electrode is conveniently removed to ensure a low resistance contact is possible therewith.

The term 'amorphizing' will be taken to mean any process which converts a substantially crystalline region of a material into a substantially amorphous region. Related terms such as 'amorphisation' and 'amorphized' will hereinafter adopt meanings taken from the aforementioned definition.

Removing the upper amorphous portion of the gate electrode may be executed by polishing or etching the uppermost exposed surface of the electrode for example. Each of these processes are simple and require little in the way of extra equipment beyond that already present in a CMOS or advanced CMOS process line.

Approximately 20-50 nm of the uppermost surface of the gate electrode is removed, although this will depend on the extent of the regrowth of the silicon gate. As mentioned above, the subsequent removal of the amorphous portion of the gate electrode enables low temperatures to be employed. For example, solid phase epitaxial regrowth of the amorphized regions can be carried out by heating the substrate to a temperature in the range of 600° C.-750° C. The duration of the heating will depend on the temperature adopted.

Removing the high resistance part of the gate electrode allows a low resistance contact to be made therewith. This contact can be further enhanced by forming a silicide contact region on the gate electrode. Preferably, this is done by depositing a metal layer over the gate electrode after said removing step, and then, heating the substrate so as to form a silicide contact region on the gate electrode.

In a preferred embodiment, the semiconductor device manufactured in accordance with the invention is incorporated into an integrated circuit chip. This can be fabricated using well-established CMOS or advanced CMOS processing factories.

Embodiments of the invention will now be described, by way of example only, with reference to the following drawings in which.

It will be appreciated that the figures are merely schematic. The same reference numerals are used throughout the figures to denote the same or similar parts.

Figure 4:
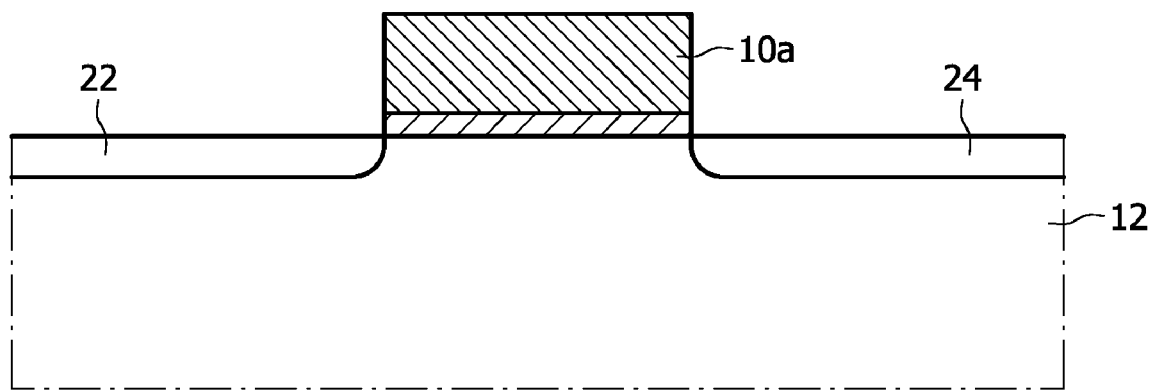

The invention provides a simple route to fabricating a MOS transistor having a low resistance polysilicon gate whilst accommodating the amorphizing and low temperature regrowth processing required to form shallow, abrupt junctions. FIGS. 1 and 4 will now be used to describe an example embodiment of the method according to the invention.

Figure 1A:
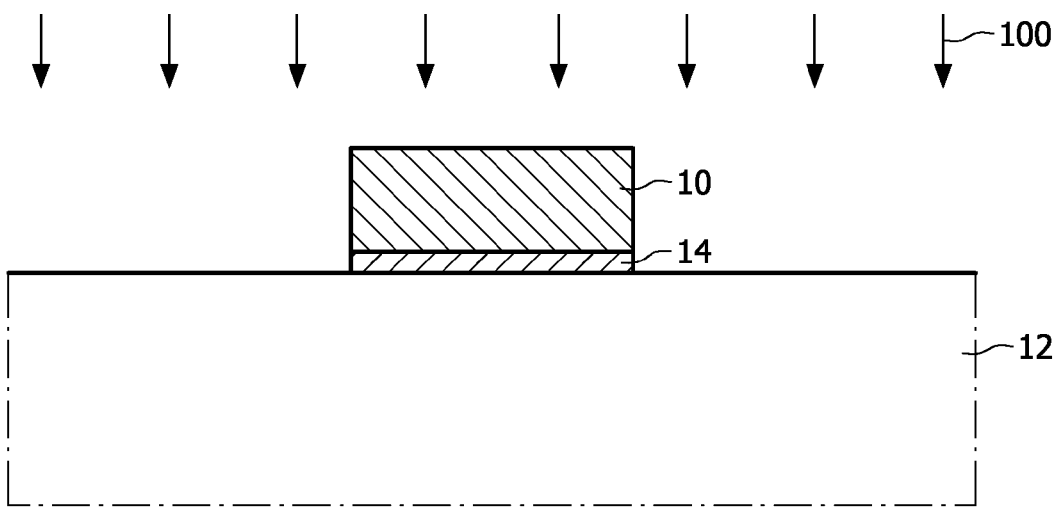
FIG. 1 shows a highly schematic sectional view through the gate and channel region of a MOS transistor at two stages of a known fabrication process.

With reference to FIG. 1a, a dielectric layer is deposited on a silicon substrate 12. The dielectric layer may be formed of silicon oxide or silicon nitride for example. A layer of polysilicon 14 is then deposited over the substrate to a thickness of approximately 100 nm.

Deposition of the gate dielectric layer 12 and the polysilicon layer 14 is implemented using known deposition techniques such as epitaxial growth, chemical vapour deposition (CVD) or atomic layer deposition (ALD).

The polysilicon layer and the dielectric layer are then patterned using standard lithographic techniques to provide a gate stack having a polysilicon gate electrode 10 on the silicon substrate 12, separated therefrom by a gate dielectric 14. For example, a photoresist may be employed to mask off a plurality of regions across the substrate corresponding to the desired locations for isolated gate stacks to be formed. An etching step can then be used to remove the unwanted regions of the polysilicon layer 14 and the dielectric layer 12. The photoresist is then removed to leave isolated gate stacks across the substrate. It will be appreciated that in a typical integrated circuit device many separate gate stacks will be formed across a single wafer. However, to maintain simplicity in describing the invention, the method will be described in relation to a single gate stack only (as shown in FIG. 1a).

A germanium implant is then carried out to amorphize the exposed surface of the silicon substrate and the gate electrode 10, as represented by arrows 100. The implant is carried out at an energy of 8 to 30 keV with a dose of 5e14 to 1e15 at/cm$^3$. The action of the atom bombardment on the uppermost surface causes a disruption of the crystalline structure, thereby providing a finite depth of amorphous silicon. This amorphization serves to limit the subsequent diffusion of dopant ions into the depths of the silicon wafer 12, thereby providing the desired shallow source/drain regions.

At this stage, insulating spacers (not shown) may be formed adjacent the gate electrode to mask respective regions of the underlying substrate from the subsequent p-type doping.

Referring again to FIG. 1b, boron ions are implanted at an energy of 0.2-10 keV at a dose of between 5e14 and 5e15 at/cm$^3$. This boron implant serves to dope regions 22,24 of the silicon substrate adjacent the gate electrode 10. The doped regions will eventually serve as p-type doped conductive source and drain regions. In another embodiment an n-type semiconductor device may be provided by implanting into regions of the substrate n-type phosphorus ions instead.

A low temperature anneal is then carried out to stimulate solid phase epitaxial regrowth of the amorphized parts 22, 24 of the device, including a portion of the gate electrode. In addition to recrystallising a portion 10a of the gate electrode and the semiconductor substrate 22, 24, the anneal serves to activate the implanted boron dopant.

Figure 1B:
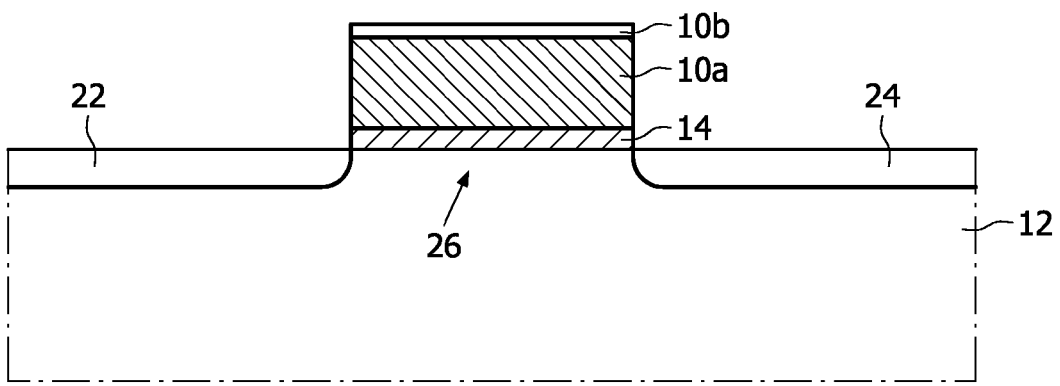
Figure 2:
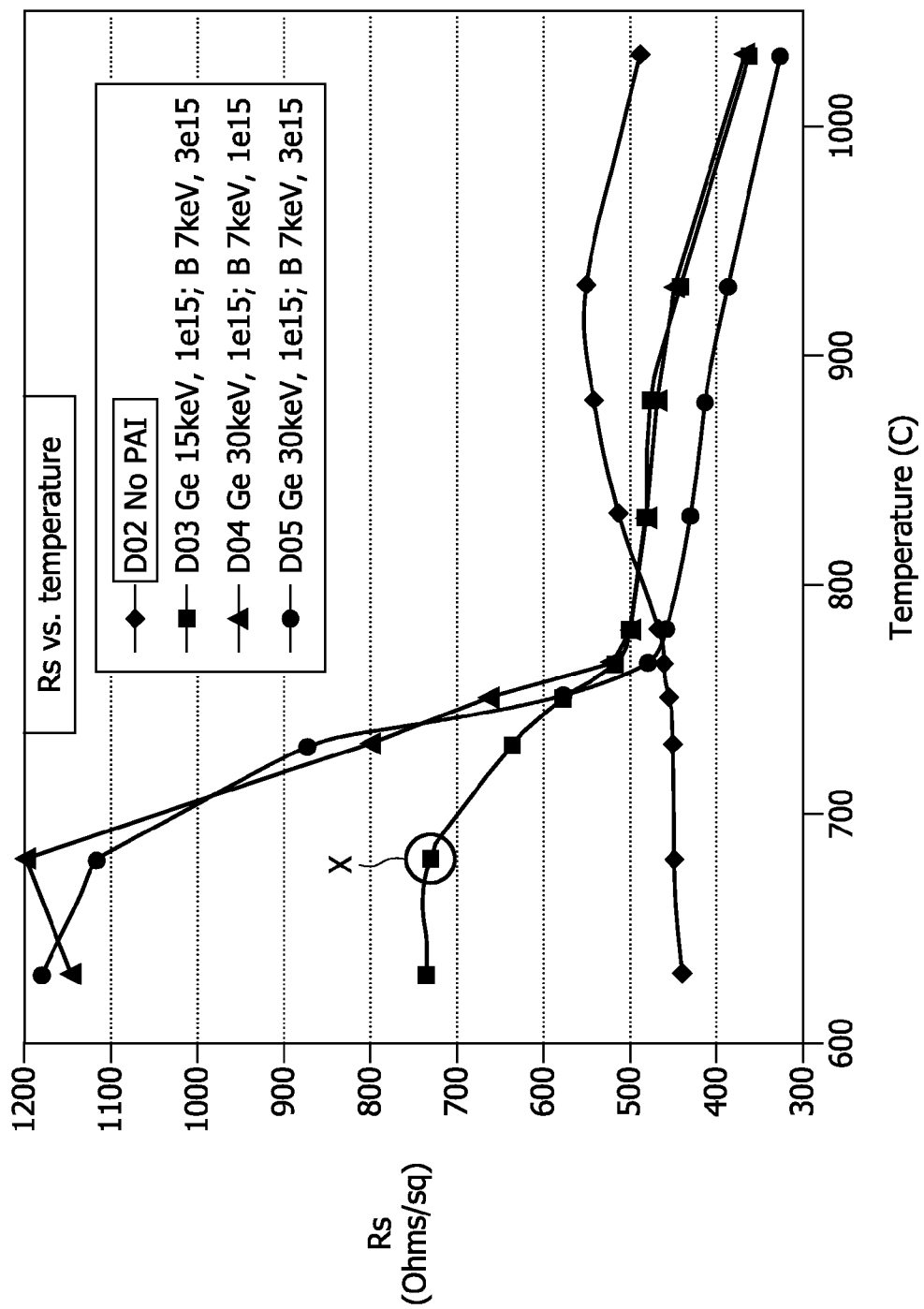
FIG. 2 is a graph showing the resistance of a gate having been amorphized and regrown with varying thermal budgets, the results taken from experimentation.
Figure 3:
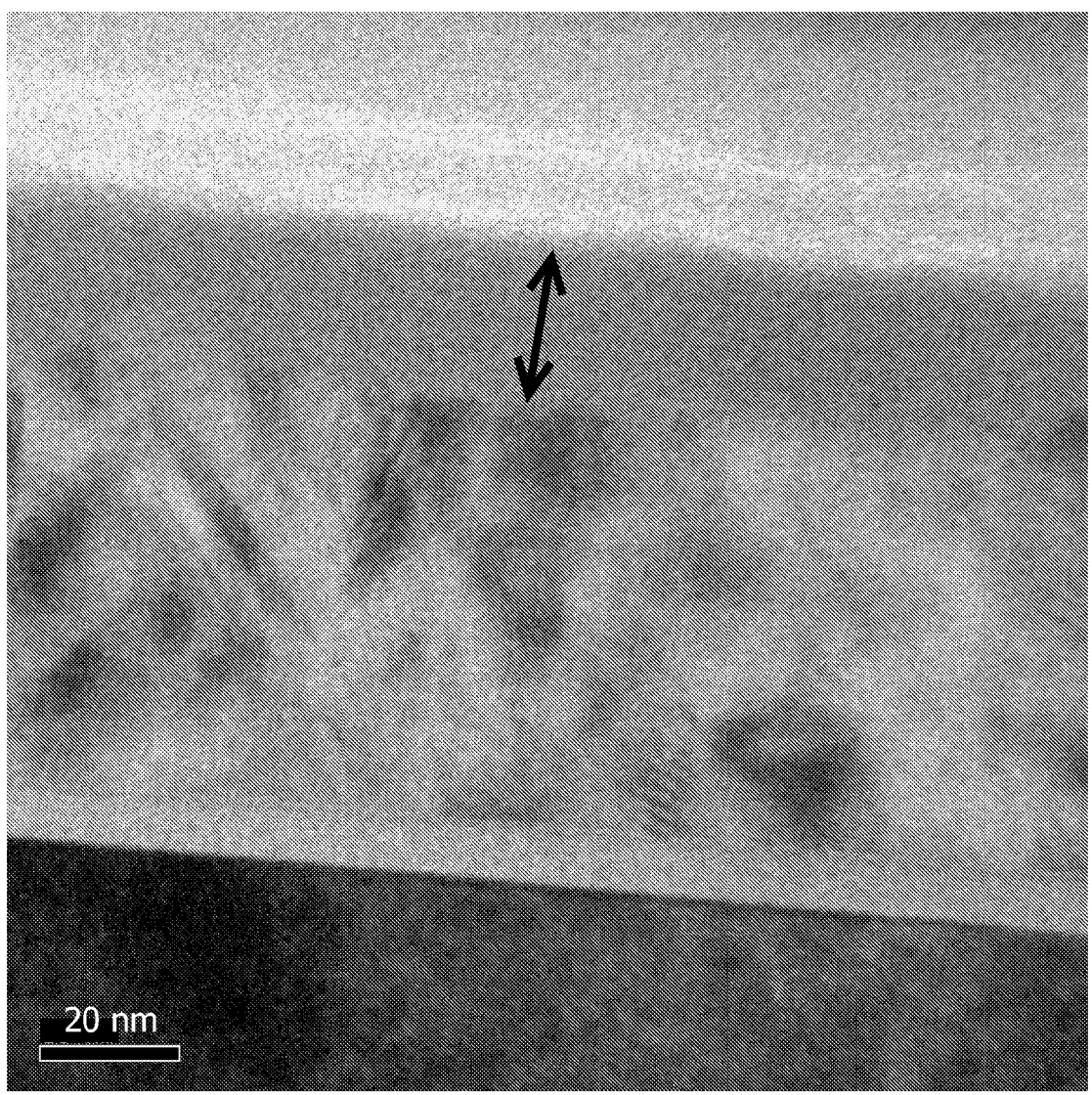
FIG. 3 is an X-TEM image of a gate having been amorphized and regrown at 680° C. for one minute; and, FIG. 4 shows a schematic sectional view through the gate and channel region of a MOS transistor manufactured by a method according to the invention.

A thermal budget of between 600-750° C., typically 650° C., for one minute is used to carry out this anneal. It is envisaged that higher temperatures can be used for a shorter duration so long as the temperature is not exceeded so as to cause destruction of the abrupt junction profiles. With reference to FIG. 1b, recrystallised source and drain regions 22 and 24 are thereby provided and separated by the undoped channel region 26. Moreover, the thermal anneal causes the silicon of the gate 10 to recrystallise to an extent so as to form a polysilicon lower portion 10a and an amorphous silicon upper portion 10b.

In accordance with a preferred embodiment of the invention, the upper portion 10b of the gate electrode is then removed by polishing the uppermost exposed surface thereof. Chemical mechanical polishing (CMP) can be employed for this purpose. The CMP serves to remove the top 20-50 nm from the uppermost surface of the gate 10. It is envisaged, however, that the thickness of the removed portion is dependent upon the extent to which the gate is recrystallised during the solid phase epitaxial re-growth. Advantageously, the polishing removes substantially all of the amorphous high resistance region of the gate, thereby enabling a low resistance contact to be formed. Due to the nature of the CMP process, the extent of the polishing may vary by +/−20 nm across the wafer.

In another preferred embodiment, the amorphous portion of the polysilicon gate is removed by a selective etch. In this case, a HF-based acid can be used for example to perform a wet etch to remove the amorphous silicon portion 10b of the gate electrode. Advantageously, only the high resistance portion of the gate is removed.

In a further embodiment, the upper portion 10b of the gate electrode is removed using a plasma (dry) etch.

FIG. 4 shows the gate stack after the removal of the top portion 10b.

A layer of nickel (not shown) is then deposited over the gate electrode to a thickness of 20-40 nm using a standard deposition technique. The substrate is then heated so as convert a portion of the nickel and underlying polysilicon into a silicide contact region. The silicide advantageously provides an even lower resistance contact with the device. Any unwanted nickel is then removed using a wet etch for example. Although nickel has been used in this embodiment it is envisaged that other metals suitable for forming a silicide may instead be used.

Further front-end processing of the substrate is then carried out to provide contacts to the semiconductor device which may then go on to form a component within an integrated circuit chip. However, this further processing will not be described as it does not relate directly to the invention.

In summary, there is provided a method of manufacturing a semiconductor device such as a MOS transistor. The device comprises a polysilicon gate and doped regions formed in a semiconductor substrate, separated by a channel region. The exposed surface of the semiconductor substrate is amorphized, by ion bombardment for example, so as to inhibit subsequent diffusion of the dopant ions during thermal annealing. Low thermal budgets are favoured for the activation and polysilicon regrowth to ensure an abrupt doping profile for the source/drain regions. As a consequence an upper portion of the gate electrode remains amorphous. The upper portion of the gate electrode is removed so as to allow a low resistance contact to be made with the polysilicon lower portion.

From reading the present disclosure, other variations and modifications will be apparent to persons skilled in the art. Such variations and modifications may involve equivalent and other features which are already known in the design, manufacture and use of semiconductors and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A method of manufacturing a semiconductor device comprising the steps of:
   forming a gate electrode of polysilicon on a semiconductor substrate;
   amorphizing the exposed surface of the semiconductor substrate and the gate electrode;
   doping regions of the semiconductor substrate adjacent the gate electrode; then,
   recrystallising a portion of the gate electrode and the semiconductor substrate; and,
   after the recrystallising, removing an upper portion of the gate electrode, wherein removing the upper portion of the gate electrode comprises removing only a high resistance region of the gate electrode.

2. A method according to claim 1, wherein said removing step comprises polishing the uppermost exposed surface of the gate electrode.

3. A method according to claim 1, wherein said removing step comprises etching the uppermost exposed surface of the gate electrode.

4. A method according to claim 1, wherein said removing step serves to remove a layer having a thickness of 20-50 nm from the uppermost surface of the electrode.

5. A method according to claim 1, wherein said recrystallising step comprises solid phase epitaxial regrowth.

6. A method according to claim 5, wherein said regrowth is carried out by heating the substrate to a temperature in the range of about 600° C.-750° C.

7. A method according to claim 1, further comprising the steps of:
   depositing a metal layer over the gate electrode after said removing step; and then,
   heating the substrate so as to form a silicide contact region on the gate electrode.

8. A method according to claim 1, further comprising the steps of:
   depositing a nickel layer over the gate electrode after said removing step; then,
   heating the semiconductor substrate so as to convert a portion of the nickel layer and underlying polysilicon into a silicide contact region; and then
   removing an unwanted portion of the nickel layer.

9. A method according to claim 7, further comprising the steps of:
   depositing a dielectric layer on top of the semiconductor substrate; and then
   depositing a layer of polysilicon on top of the dielectric layer;
   wherein forming the gate electrode of polysilicon on the semiconductor substrate comprises lithographically patterning the polysilicon layer and the dielectric layer.

10. A method according to claim 1, wherein amorphizing the exposed surface of the semiconductor substrate and the gate electrode comprises implanting germanium atoms onto the exposed surface of the semiconductor substrate and the gate electrode.

11. A method of manufacturing a semiconductor device comprising the steps of:
   depositing a dielectric layer on top of a semiconductor substrate; then
   depositing a layer of polysilicon on top of the dielectric layer; then
   lithographically patterning the polysilicon layer and the dielectric layer to form a gate electrode of polysilicon; then
   amorphizing the exposed surface of the semiconductor substrate and the gate electrode;
   doping regions of the semiconductor substrate adjacent the gate electrode; then,
   recrystallising a portion of the gate electrode and the semiconductor substrate; then
   after the recrystallising, removing an upper portion of the gate electrode; then,
   depositing a metal layer over the gate electrode after said removing step; then,
   heating the substrate so as to form a silicide contact region on the gate electrode;
   and then,
   removing an unwanted portion of the metal layer.

12. A method according to claim 11, wherein removing the upper portion of the gate electrode comprises polishing the uppermost exposed surface of the gate electrode.

13. A method according to claim 11, wherein removing the upper portion of the gate electrode comprises etching the uppermost exposed surface of the gate electrode.

14. A method according to claim 11, wherein removing the upper portion of the gate electrode serves to remove a layer having a thickness of 20-50 nm from the uppermost surface of the electrode.

15. A method according to claim 11, wherein said recrystallising step comprises solid phase epitaxial regrowth.

* * * * *